United States Patent
Andreev et al.

(10) Patent No.: US 9,239,704 B2
(45) Date of Patent: *Jan. 19, 2016

(54) VARIABLE NODE PROCESSING UNIT

(71) Applicant: Avago Technologies General IP (Singapore) Pte. Ltd., Singapore (SG)

(72) Inventors: Alexander Andreev, San Jose, CA (US); Sergey Gribok, San Jose, CA (US); Oleg Izyumin, Los Gatos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 247 days.

This patent is subject to a terminal disclaimer.

(21) Appl. No.: 13/892,589

(22) Filed: May 13, 2013

(65) Prior Publication Data
US 2013/0254252 A1 Sep. 26, 2013

Related U.S. Application Data

(63) Continuation of application No. 12/185,404, filed on Aug. 4, 2008, now Pat. No. 8,443,033.

(51) Int. Cl.
*H03M 13/11* (2006.01)
*G06F 7/575* (2006.01)

(52) U.S. Cl.
CPC ........... *G06F 7/575* (2013.01); *H03M 13/1102* (2013.01); *H03M 13/1111* (2013.01); *H03M 13/1117* (2013.01)

(58) Field of Classification Search
CPC ..................... H03M 13/1102; H03M 13/1111; H03M 13/1117
See application file for complete search history.

(56) References Cited

U.S. PATENT DOCUMENTS

| | | | |
|---|---|---|---|
| 5,189,635 A | 2/1993 | Ohki | |
| 6,539,367 B1* | 3/2003 | Blanksby et al. | 706/14 |
| 7,299,397 B2 | 11/2007 | Yokokawa et al. | |
| 7,945,768 B2* | 5/2011 | Essick et al. | 712/241 |
| 2003/0055852 A1 | 3/2003 | Wojko | |
| 2003/0229843 A1 | 12/2003 | Yu et al. | |
| 2005/0050435 A1* | 3/2005 | Kyung et al. | 714/800 |
| 2007/0217522 A1* | 9/2007 | Sun et al. | 375/242 |
| 2008/0052558 A1 | 2/2008 | Sun et al. | |
| 2009/0083604 A1* | 3/2009 | Tong et al. | 714/752 |

OTHER PUBLICATIONS

R.G. Gallager, "Low density parity check codes," IRE Trans. Inform. Theory, vol. IT-8, pp. 21-28, Jan. 1962.
D.J.C. MacKay and R.M. Neal, "Near Shannon limit performance of low density parity check codes," Electron. Lett., vol. 32, No. 18, pp. 1645-1646, 1996.

* cited by examiner

*Primary Examiner* — Chuong D Ngo

(57) ABSTRACT

A low-density parity check min-sum decoder including a variable node processing unit having N+1 inputs. A first bank of N+1 two-input adders each have an associated output, and at least one of the N+1 inputs go to more than two of the adders of the first bank. A second bank of N two-input adders has no adders in common with the first bank. At least one of the adders of the first bank provides its associated output to more than one adder of the second bank. The banks of adders are disposed in series. A sign module outputs a sign value produced from one of the inputs and an output from one of the adders of the second bank. N+1 outputs are provided, where one of the outputs is the sign value.

12 Claims, 5 Drawing Sheets

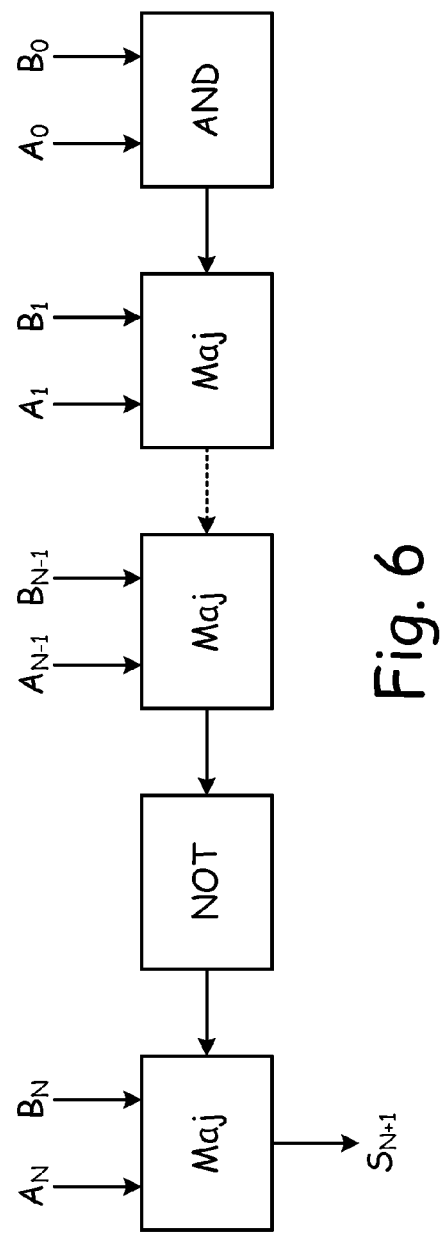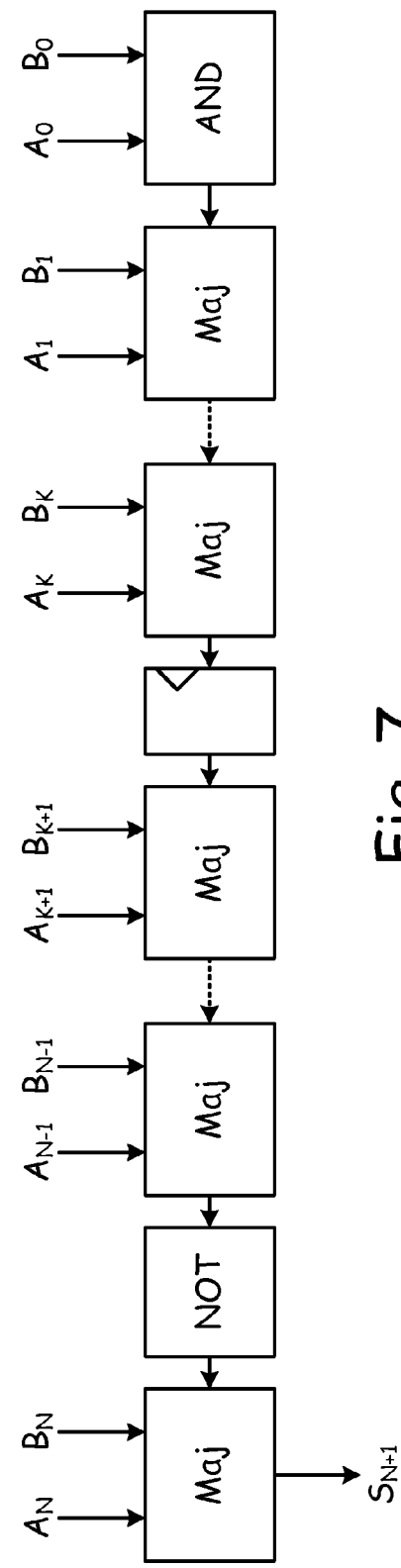
Fig. 6
Fig. 7

VARIABLE NODE PROCESSING UNIT

This application is a continuation application claiming priority on prior pending U.S. patent application Ser. No. 12/185,404 filed 2008 Aug. 4.

FIELD

This invention relates to the field of integrated circuit design. More particularly, this invention relates to an efficient hardware implementation of a variable node processing unit (VNU) inside of a low-density parity check (LDPC) min-sum decoder.

BACKGROUND

Low density parity-check (LDPC) codes were first proposed by Gallager in 1962, and then "rediscovered" by MacKay in 1996. LDPC codes have been shown to achieve an outstanding performance that is very close to the Shannon transmission limit. However it is very difficult to build an efficient hardware implementation of a circuit for decoding LDPC codes. All existing hardware implementations of LDPC decoding algorithms suffer from low speed and large area and power requirements. It is very important to develop an LDPC-decoder that has better speed, area, and power characteristics than the existing implementations.

The most promising algorithm for decoding LDPC-codes is so the called min-sum algorithm. Generally speaking this algorithm performs two main operations 1. Find a minimum number among a given set of signed numbers, and
2. For a given group of signed numbers $A_1, \ldots, A_N$ and a signed number M calculate:

$$S_i = S - A_i,$$

where $$i = 1, \ldots N, S = A_1 + \ldots + A_N + M,$$

and $$\text{SIGN} = \text{sign}(S) = \{0, \text{ if } S \geq 0; 1, \text{ if } S < 0\}.$$

A typical hardware implementation of this algorithm represents the LDPC decoder as a set of multiple node processing units performing operations (1) and (2) as given above. There are two types of units:

1. So-called "check node processing units" (CNU) that perform operation (1), and
2. So-called "variable node processing units" (VNU) that perform operation (2).

The decoder may contain up to thousands of these two units working in parallel. One hardware realization of a VNU as depicted in FIG. 1 contains N-input adder module (denoted by the "+" sign) for calculating the total sum S, and N two-input subtractor modules (denoted by the "−" sign) for calculating "partial" sums Si.

What is needed, therefore, is a VNU that improves—at least in part—the speed, area, and power characteristics of the VNU, and therefore enables the construction of a better LDPC decoder.

SUMMARY

The above and other needs are met by a low-density parity check min-sum decoder including a variable node processing unit having N+1 inputs, a first bank of N+1 two-input adders, each having an associated output, at least one of the N+1 inputs going to more than two of the adders of the first bank, a second bank of N two-input adders, the first bank and the second bank having no adders in common, at least one of the adders of the first bank providing its associated output to more than one adder of the second bank, the banks of adders disposed in series, a sign module for outputting a sign value produced from one of the inputs and an output from one of the adders of the second bank, and N+1 outputs, where one of the outputs is the sign value.

In various embodiments according to this aspect of the invention, at least one of the two-input adders is a signed ripple-carry adder. In some embodiments at least one of the two-input adders is a signed ripple-carry adder that includes logic elements and a flip-flop interjected between two adjacent ones of the logic elements. In some embodiments each of the two-input adders is a signed ripple-carry adder with logic elements and a flip-flop interjected between two adjacent ones of the logic elements.

According to another aspect of the invention there is described a variable node processing unit having N+1 inputs, a first bank of N+1 two-input adders, at least one of the N+1 inputs going to more than two of the adders of the first bank, each having an associated output, a second bank of N two-input adders, the first bank and the second bank having no adders in common, at least one of the adders of the first bank providing its associated output to more than one adder of the second bank, the banks of adders disposed in series, a sign module for outputting a sign value produced from one of the inputs and an output from one of the adders of the second bank, and N+1 outputs, where one of the outputs is the sign value.

In various embodiments according to this aspect of the invention, at least one of the two-input adders is a signed ripple-carry adder. In some embodiments at least one of the two-input adders is a signed ripple-carry adder that includes logic elements and a flip-flop interjected between two adjacent ones of the logic elements. In some embodiments each of the two-input adders is a signed ripple-carry adder with logic elements and a flip-flop interjected between two adjacent ones of the logic elements.

According to yet another aspect of the invention there is described a method for electronically decoding a parity check by electronically providing N+1 inputs to a first bank of N+1 two-input adders, each having an associated output, at least one of the N+1 inputs going to more than two of the adders of the first bank, electronically providing the outputs from the first bank to a second bank of N two-input adders that is disposed in series with the first bank, electronically providing the output from at least one of the adders of the first bank to more than one adder of the second bank, electronically outputting a sign value produced from one of the inputs and an output from one of the adders of the second bank, and electronically producing N+1 outputs, where one of the outputs is the sign value.

In various embodiments according to this aspect of the invention, at least one of the two-input adders is a signed ripple-carry adder. In some embodiments at least one of the two-input adders is a signed ripple-carry adder that includes logic elements and a flip-flop interjected between two adjacent ones of the logic elements. In some embodiments each of the two-input adders is a signed ripple-carry adder with logic elements and a flip-flop interjected between two adjacent ones of the logic elements.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 6 is a functional representation of a sign calculation submodule according to an embodiment of the present invention.

FIG. 7 is a functional representation of a two-stage sign calculation submodule according to an embodiment of the present invention.

DETAILED DESCRIPTION

Figure 1:
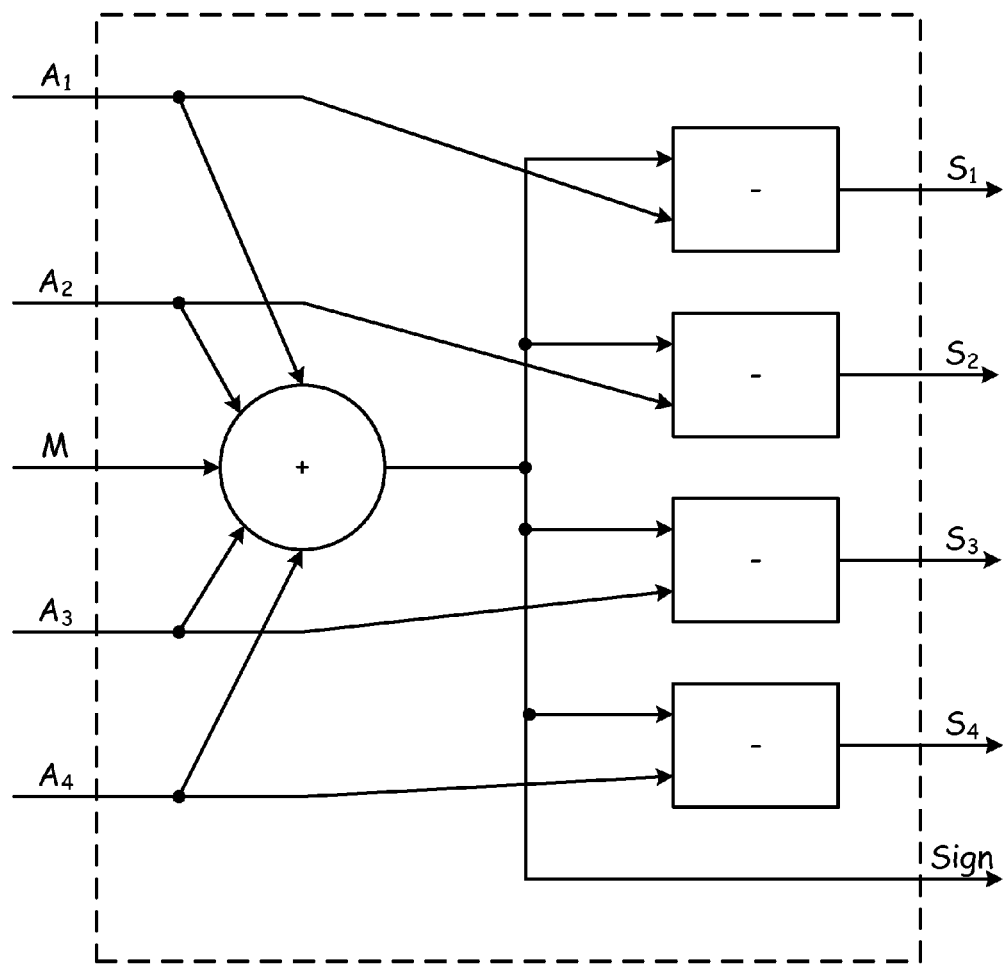
FIG. 1 is a functional representation of a prior art VNU.
Figure 2:
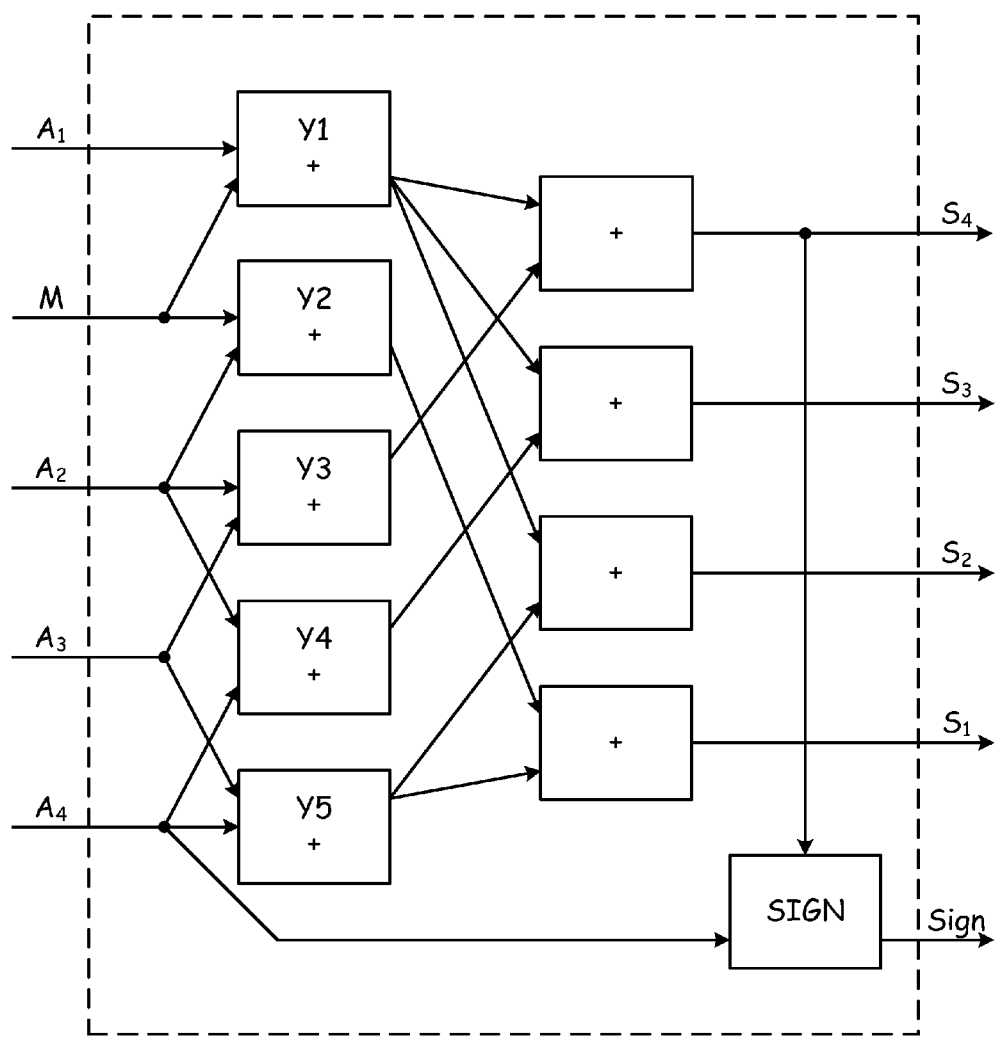
FIG. 2 is a functional representation of a VNU according to an embodiment of the present invention.
Figure 3:
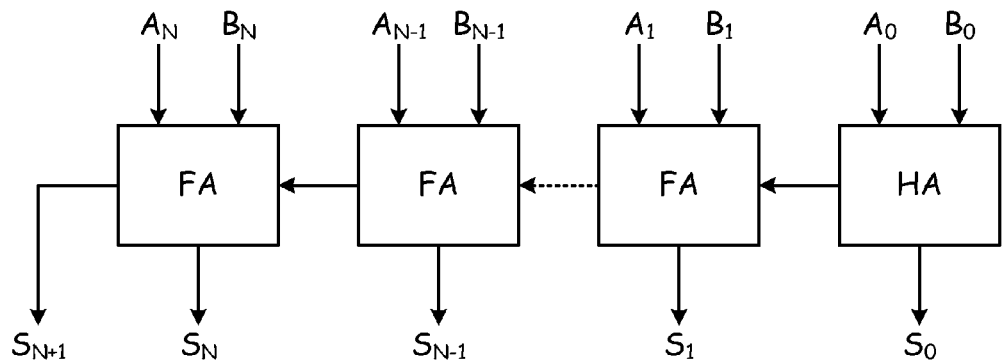
FIG. 3 is a functional representation of a prior art Ripple-Carry adder.

Instead of using an N-input summator followed by subtractors, the embodiments of the present invention use simultaneous implementation of N partials sums Si and SIGN as shown in FIG. 2. If N=4 (the most common value for a high-rate LDPC code) then the following equations are used to calculate the partial sums and the sign value:

$y1 = M + A1$ $y2 = M + A2$ $y3 = A2 + A3$ $y4 = A2 + A4$ $y5 = A3 + A4$ $S1 = y2 + y5$ $S2 = y1 + y5$ $S3 = y1 + y4$ $S4 = y1 + y3$ $SIGN = \text{sign}(A4 + S4)$ Implementation of the Adder Submodule To further reduce the circuit area, a Ripple-Carry implementation of two-input adders inside the VNU is used. Conventional Ripple-Carry adders use N logic elements to implement an addition of two N-bit unsigned numbers A and B, as shown in FIG. 3. The output of the Ripple-Carry adder is (N+1)-bit unsigned number S such that S=A+B. Note that there is no overflow in the circuit because the sum width is greater then the items width.

Figure 4:
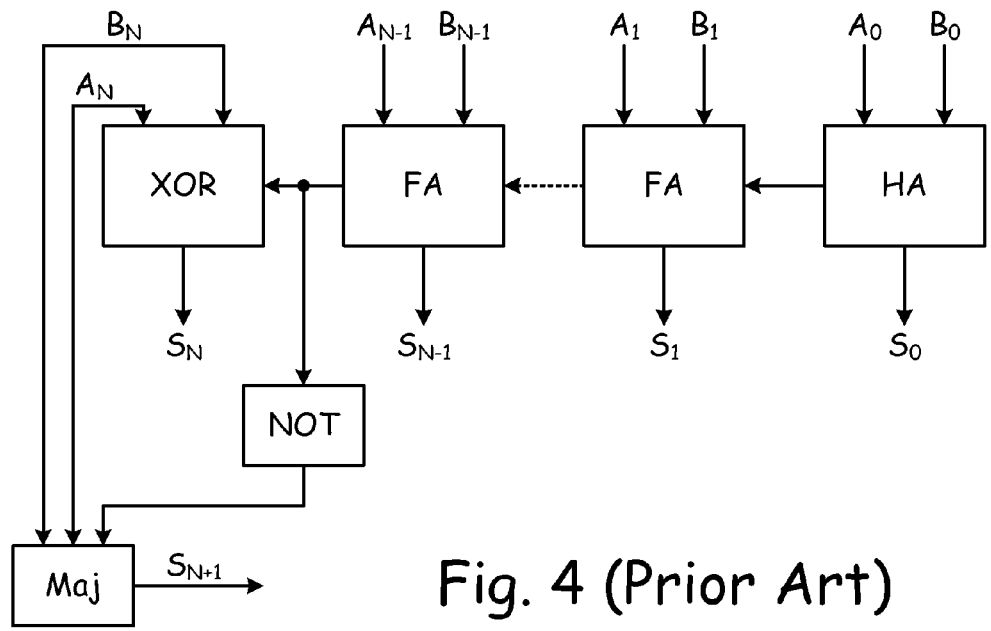
FIG. 4 is a functional representation of an enhanced prior art Ripple-Carry adder modified for signed numbers.

An enhancement according to the basic Ripple-Carry adder depicted in FIG. 3 permits the addition of signed numbers, and is depicted in FIG. 4. The enhanced adder uses N+1 logic elements to implement the addition of two N-bit signed numbers A and B in complement representation. The output of the Signed Ripple-Carry adder is (N+1)-bit signed number S in complement representation such that S=A+B. Note again there is no overflow in the circuit because the sum width is greater then the items width.

Figure 5:
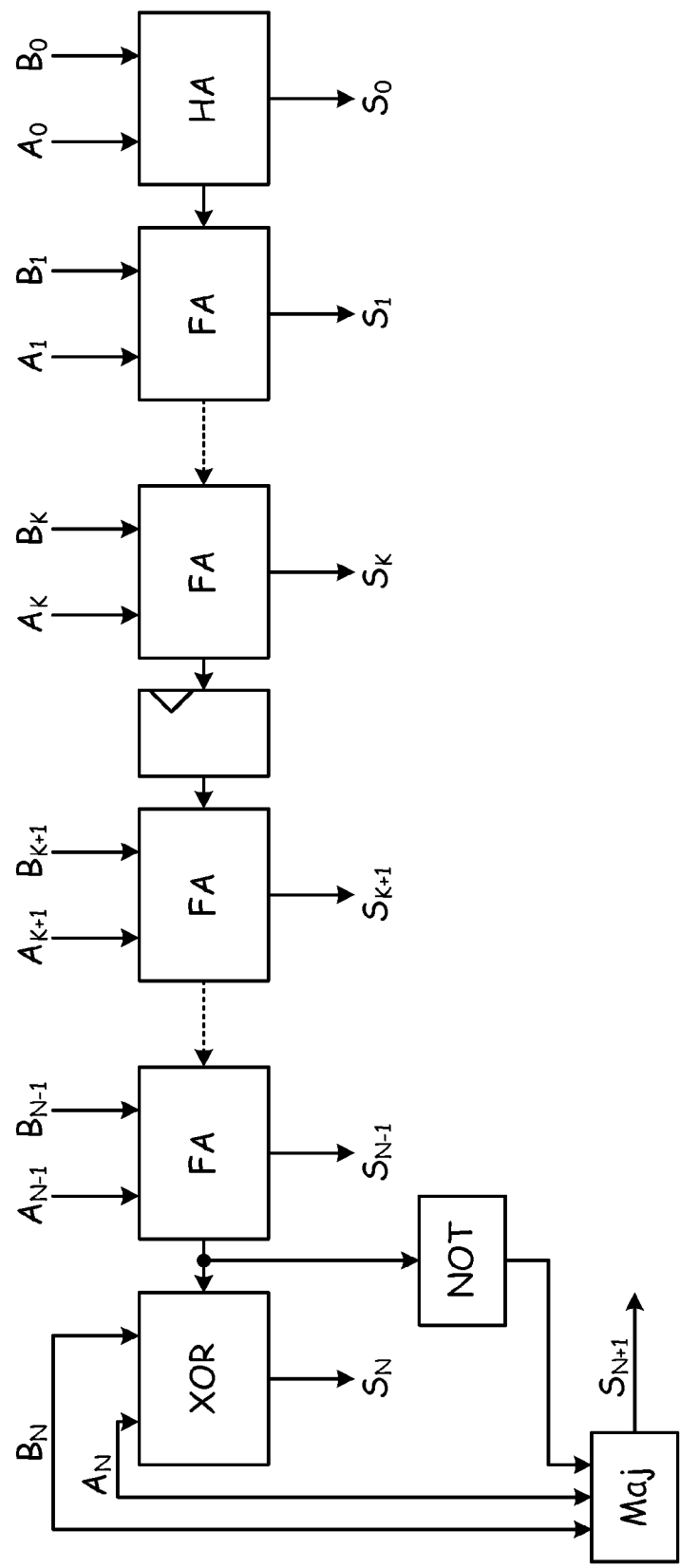
FIG. 5 is a functional representation of a two-stage signed Ripple-Carry adder according to an embodiment of the present invention.

Ripple-Carry adders are very small and power-efficient, but the circuit delay is relatively big (for example, delay from inputs $A_0$ and $B_0$ to output $S_{N+1}$). To reduce the delay of the circuit, the Ripple-Carry adders are segmented by inserting a flip-flop somewhere in the middle of the chain of Full-Adders, as depicted in FIG. 5. The exact position of the dividing flip-flop depends on various parameters and may be different for different instances of the Ripple-Carry adder disposed inside of the VNU.

Implementation of the Sign Calculation Submodule

As mentioned above, the SIGN value is calculated by the formula:

$SIGN = \text{sign}(A4 + S4)$.

To calculate this value, a two-input adder can be used to find the sum S=A4+S4 and then take the uppermost bit of the sum to obtain the sign. However, in some embodiments an optimized circuit is used that calculates the sign of the sum without calculating the sum itself. The corresponding circuit is depicted in FIG. 6, and consists of a chain of so-called majority cells.

To further optimize the circuit speed, the chain of majority cells is segmented by inserting a flip-flop in the same manner as for the Ripple-Carry adder described above. The corresponding circuit is depicted in FIG. 7.

The circuits above use the following logic elements:

| HA (Half-Adder) | | | |
|---|---|---|---|
| Inputs | | Outputs | |
| X (Left Upper) | Y (Right Upper) | $C_{out}$ (Left) | S (Bottom) |
| 0 | 0 | 0 | 0 |
| 0 | 1 | 0 | 1 |
| 1 | 0 | 0 | 1 |
| 1 | 1 | 1 | 0 |

| FA (Full Adder) | | | | |
|---|---|---|---|---|
| Inputs | | | Outputs | |
| X (Left Upper) | Y (Right Upper) | $C_{in}$ (Right) | $C_{out}$ (Left) | S (Bottom) |
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

| XOR | | | |
|---|---|---|---|
| Inputs | | | Output |
| X (Left Upper) | Y (Right Upper) | $C_{in}$ (Right) | $C_{out}$ |
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A low-density parity check min-sum decoder including a variable node processing unit comprising:

N+1 inputs, a first bank of N+1 two-input adders, each having an associated output, at least one of the N+1 inputs going to more than two of the adders of the first bank, a second bank of N two-input adders, the first bank and the second bank having no adders in common, at least one of the adders of the first bank providing its associated output to more than one adder of the second bank, the banks of adders disposed in series, a sign module for outputting a sign value produced from one of the inputs and an output from one of the adders of the second bank, and N+1 outputs, where one of the outputs is the sign value.

2. The decoder of claim 1, wherein at least one of the two-input adders is a signed ripple-carry adder.

3. The decoder of claim 1, wherein at least one of the two-input adders is a signed ripple-carry adder that includes logic elements and a flip-flop interjected between two adjacent ones of the logic elements.

4. The decoder of claim 1, wherein each of the two-input adders is a signed ripple-carry adder with logic elements and a flip-flop interjected between two adjacent ones of the logic elements.

5. A variable node processing unit comprising:

N+1 inputs, a first bank of N+1 two-input adders, at least one of the N+1 inputs going to more than two of the adders of the first bank, each having an associated output, a second bank of N two-input adders, the first bank and the second bank having no adders in common, at least one of the adders of the first bank providing its associated output to more than one adder of the second bank, the banks of adders disposed in series, a sign module for outputting a sign value produced from one of the inputs and an output from one of the adders of the second bank, and N+1 outputs, where one of the outputs is the sign value.

6. The variable node processing unit of claim 5, wherein at least one of the two-input adders is a signed ripple-carry adder.

7. The variable node processing unit of claim 5, wherein at least one of the two-input adders is a signed ripple-carry adder that includes logic elements and a flip-flop interjected between two adjacent ones of the logic elements.

8. The variable node processing unit of claim 5, wherein each of the two-input adders is a signed ripple-carry adder with logic elements and a flip-flop interjected between two adjacent ones of the logic elements.

9. A method for electronically decoding a parity check, the method comprising:

electronically providing N+1 inputs to a first bank of N+1 two-input adders, each having an associated output, at least one of the N+1 inputs going to more than two of the adders of the first bank, electronically providing the outputs from the first bank to a second bank of N two-input adders that is disposed in series with the first bank, electronically providing the output from at least one of the adders of the first bank to more than one adder of the second bank, electronically outputting a sign value produced from one of the inputs and an output from one of the adders of the second bank, and electronically producing N+1 outputs, where one of the outputs is the sign value.

10. The method of claim 9, wherein at least one of the two-input adders is a signed ripple-carry adder.

11. The method of claim 9, wherein at least one of the two-input adders is a signed ripple-carry adder that includes logic elements and a flip-flop interjected between two adjacent ones of the logic elements.

12. The method of claim 9, wherein each of the two-input adders is a signed ripple-carry adder with logic elements and a flip-flop interjected between two adjacent ones of the logic elements.

* * * * *